(12) United States Patent
Mathur et al.

(10) Patent No.: US 10,673,434 B2
(45) Date of Patent: Jun. 2, 2020

(54) AUTO-CORRECTED IO DRIVER ARCHITECTURE

(71) Applicant: SANDISK TECHNOLOGIES LLC, Addison, TX (US)

(72) Inventors: Shiv Harit Mathur, Karnataka (IN); Anand Sharma, Karnataka (IN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/145,839

(22) Filed: Sep. 28, 2018

(65) Prior Publication Data

US 2020/0106438 A1    Apr. 2, 2020

(51) Int. Cl.
| | |
|---|---|
| *H03K 19/00* | (2006.01) |
| *H03K 19/003* | (2006.01) |
| *G11C 7/10* | (2006.01) |

(52) U.S. Cl.
CPC ....... *H03K 19/0005* (2013.01); *G11C 7/1051* (2013.01); *H03K 19/00384* (2013.01); *G11C 2207/2254* (2013.01)

(58) Field of Classification Search
CPC ......... H03K 19/0005; H03K 19/00384; G11C 7/1051; G11C 2207/2254
See application file for complete search history.

(56) References Cited

U.S. PATENT DOCUMENTS

| | | | |
|---|---|---|---|
| 2002/0135406 A1* | 9/2002 | Hossain | H03K 19/00384 327/112 |
| 2004/0008059 A1 | 1/2004 | Chen et al. | |
| 2005/0242830 A1 | 11/2005 | Humphrey et al. | |
| 2018/0123593 A1* | 5/2018 | Choi | G11C 29/028 |

OTHER PUBLICATIONS

Su, Chao, "Dynamic calibration of current-steering DAC" (2007). Retrospective Theses and Dissertations. 15950.

* cited by examiner

*Primary Examiner* — Seokjin Kim
(74) *Attorney, Agent, or Firm* — Michael Best & Friedrich LLP

(57) ABSTRACT

A circuit or associated system or method comprises a first driver including a first transistor bank and a first resistor connected in series between a first predetermined voltage and an output pad, the first transistor bank including a first driver transistor and a plurality of first calibration transistors, wherein the plurality of first calibration transistors are respectively controlled based on a combination of bits of a first calibration code and on an output of at least one first logic gate.

20 Claims, 9 Drawing Sheets

AUTO-CORRECTED IO DRIVER ARCHITECTURE

BACKGROUND

1. Field of the Disclosure

This application relates generally to a driver, such as an IO driver. More specifically, this application relates to an auto-corrected IO driver architecture to minimize quantization error over process, voltage, and temperature (PVT) variations.

2. Description of Related Art

An IO driver is an electronic circuit that controls the communication of electronic signals on a communication bus, for example by pushing and pulling the bus to high or low voltage levels. Such a driver is sometimes called a "push-pull driver" or a "pull-up pull-down driver," and includes several circuit components. The respective output impedances of these components, and thus the output impedance of the driver itself, may include variations from several sources including the process used to manufacture the components, temperature fluctuations during operation, and voltage variations. These are collectively referred to as PVT variations.

Variations in driver impedance directly impact signal quality, jitter, supply noise, and duty cycle distortion (DCD). To control driver impedance across PVT variations, it is possible to calibrate the components of the driver circuit; however, some calibration techniques and architectures require a large silicon area (that is, physical area) on the driver chip, require a large amount of time to perform calibration, or render the IO driver incapable of high-speed operation.

Accordingly, there exists a need for an IO driver that exhibits minimal quantization error and impedance variation across PVT variations, requires a short calibration time, and occupies an acceptably small silicon area on the chip.

BRIEF SUMMARY OF THE DISCLOSURE

Various aspects of the present disclosure relate to circuits, systems, and methods for reducing noise and/or errors caused by PVT variations to thereby achieve a higher data rate of a link with a compact architecture.

In one exemplary aspect of the present disclosure, there is provided a circuit, comprising a first driver including a first transistor bank and a first resistor connected in series between a first predetermined voltage and an output pad, the first transistor bank including a first driver transistor and a plurality of first calibration transistors, wherein the plurality of first calibration transistors are respectively controlled based on a first calibration code having K most significant bits and L least significant bits and on an output of at least one first logic gate, wherein K and L are positive integers.

In another exemplary aspect of the present disclosure, there is provided a system, comprising a memory array and an IO driver circuit configured to output a signal to the memory array, the IO driver circuit including a first driver including a first transistor bank and a first resistor connected in series between a first predetermined voltage and an output pad, the first transistor bank including a first driver transistor and a plurality of first calibration transistors, a second driver including a second transistor bank and a second resistor connected in series between a second predetermined voltage and the output pad, the second transistor bank including a second driver transistor and a plurality of second calibration transistors, and a logic circuit configured to receive a first calibration code and a second calibration code each having K most significant bits and L least significant bits where K and L are positive integers, to vary an impedance of the first driver based on the first calibration code, and to vary an impedance of the second driver based on the second calibration code.

In another exemplary aspect of the present disclosure, there is provided a method, comprising selectively providing, by a pull-up driver, a path between a first predetermined voltage and an output pad by controlling a first transistor bank and a first resistor connected in series therebetween, the first transistor bank including a first driver transistor and a plurality of first calibration transistors; selectively providing, by a pull-down driver, a path between a second predetermined voltage and the output pad by controlling a second transistor bank and a second resistor connected in series therebetween, the second transistor bank including a second driver transistor and a plurality of second calibration transistors; controlling the plurality of first calibration transistors by a logical combination of the K most significant bits of a first calibration code and the L least significant bits of the first calibration code, K and L being positive integers; and controlling the plurality of second calibration transistors by a logical combination of the K most significant bits of a second calibration code and the L least significant bits of the second calibration code.

In this manner, various aspects of the present disclosure provide for improvements in at least the technical fields of memory devices and their design and architecture.

This disclosure can be embodied in various forms, including hardware or circuits controlled by computer-implemented methods, computer program products, computer systems and networks, user interfaces, and application programming interfaces; as well as hardware-implemented methods, signal processing circuits, memory arrays, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as circuit configurations, waveform timings, circuit operations, and the like, in order to provide an understanding of one or more aspects of the present disclosure. It will be readily apparent to one skilled in the art that these specific details are merely exemplary and not intended to limit the scope of this application.

Moreover, while the present disclosure focuses mainly on examples in which the various circuits are used in memory arrays, it will be understood that this is merely one example of an implementation. It will further be understood that the disclosed circuits can be used in any device in which there is a need to provide a driving signal; for example, an audio circuit, an industrial measurement and control circuit, a display device, a communication circuit, and so on.

Driver Chip Architecture

Figure 1:
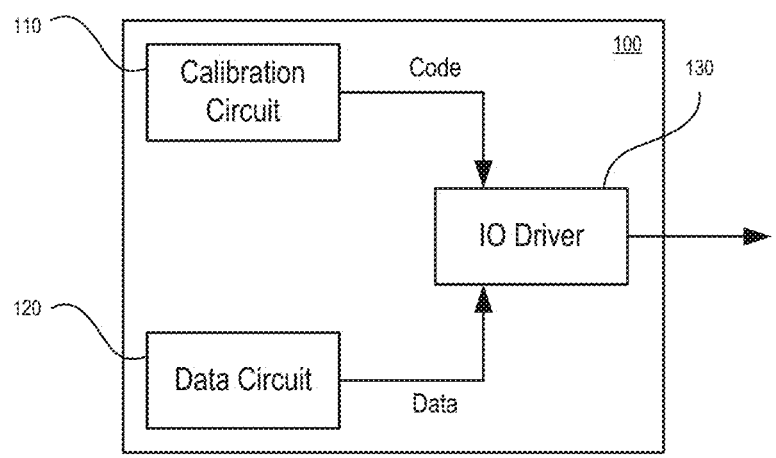
FIG. 1 illustrates an exemplary block diagram for a driver architecture according to various aspects of the present disclosure.

FIG. 1 illustrates a block diagram for an exemplary driver chip architecture according to various aspects of the present disclosure. FIG. 1 illustrates a chip 100, such as a silicon-based printed circuit board, which includes a calibration circuit 110, a data circuit 120, and an IO driver 130. In operation, the calibration circuit 110 provides a calibration code (denoted as "Code") to the IO driver 130 so as to reduce impedance variation of the IO driver 130. The data circuit 120 provides a data signal Data to the IO driver 130, which determines the output of the IO driver 130. Code is a digital signal representing a particular calibration configuration for the IO driver 130, and may be represented in binary form as a series of n bits. For example, where a 5-bit calibration code is used, Code may have a value ranging from decimal 0 (binary 00000) to decimal 31 (binary 11111). In general, the notation Code<x:y> is used to represent a (x−y+1)-bit string of the calibration signal having sequential bits x, x−1, x−2, . . . , y+1, y. For the example of a 5-bit calibration code having a value of decimal 0, then, Code<4:0> represents the 5-bit string 00000 and Code<3:2> represents the 2-bit string 00.

While FIG. 1 illustrates a single IO driver 130, in practice several IO drivers operate in tandem. For example, the chip 100 may include a plurality of similar copies of the IO driver 130. In some implementations, the chip 100 includes eight, sixteen, or thirty-two similar copies of the IO driver 130. Moreover, while FIG. 1 illustrates a configuration where each of the calibration circuit 110, the data circuit 120, and the IO driver 130 are integrated into a single chip, in practice one or both of the calibration circuit 110 and the data circuit 120 may be provided on one or more separate chips as compared to the IO driver (or drivers, as may be the case) 130.

The calibrated output of the IO driver 130 may be output to any circuit which receives a signal that varies between two distinct values, including but not limited to a memory array, a communication bus, an automotive circuit, or any other circuit where IO driving is desired or required.

Binary Calibration

Figure 2:
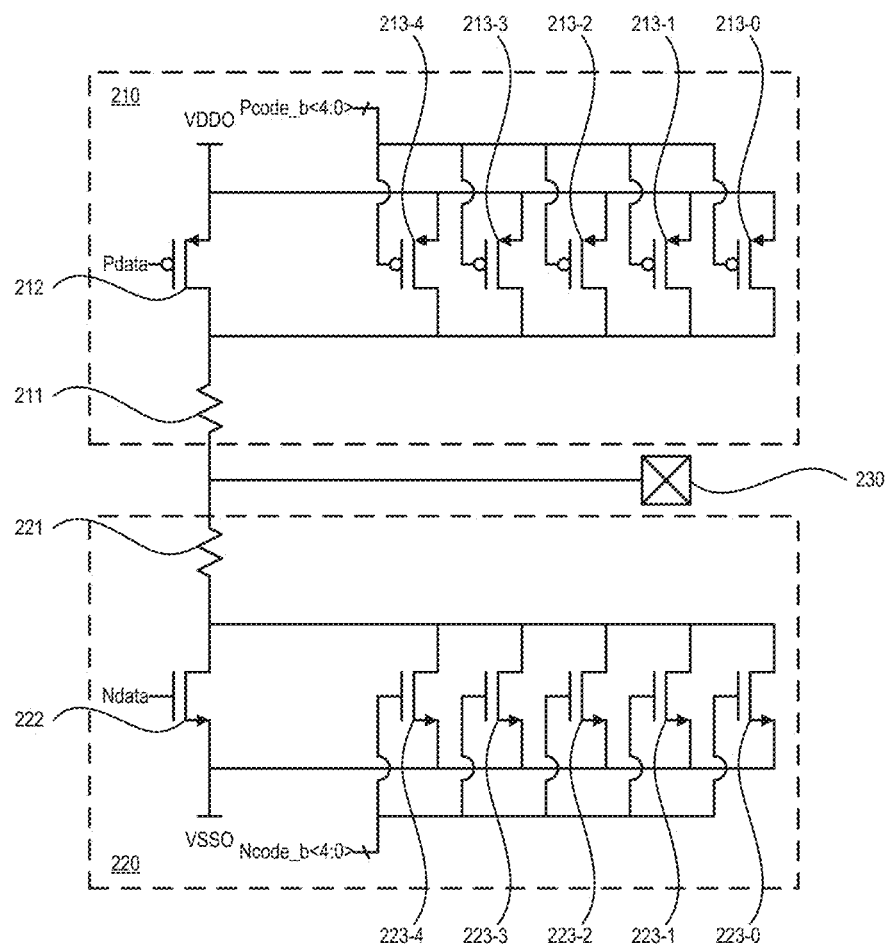
FIG. 2 illustrates a circuit diagram for a first comparative example of an IO driver.

FIG. 2 illustrates a comparative example of an IO driver, which may be implemented as the IO driver 130 of FIG. 1, where the calibration is a pure binary calibration. The IO driver includes a pull-up driver 210 (also called a P-leg driver), a pull-down driver 220 (also called an N-leg driver), and an output pad 230. The pull-up driver 210 selectively provides a path between a high voltage VDDO, such as a power source voltage, and the output pad 230 in response to a data signal Pdata and a P-leg binary calibration code (denoted "Pcode_b"). The pull-down driver 220 selectively provides a path between a low voltage VSSO, such as a ground voltage, and the output pad 230 in response to a data signal Ndata and an N-leg binary calibration code (denoted "Ncode_b"). Here, Pcode_b and Ncode_b are 5-bit binary codes.

The pull-up driver 210 includes a resistor 211 and a transistor bank including a driver transistor 212 and a plurality of (here, five) calibration transistors 213-4 to 213-0 (collectively referred to as the calibration transistors 213-$i$). As used herein, a "calibration transistor," such as the calibration transistors 213-$i$, is one of a plurality of transistors arranged in parallel with each other and with a corresponding driver transistor, such as the driver transistor 212. The transistors include a gate terminal, a source terminal, and a drain terminal. Depending on a voltage level at the gate terminal, a current may flow between the source terminal and the drain terminal. In various embodiments, a variety of transistor types can be used. In one embodiment, however, the transistors are field-effect transistors (FETs), such as Metal-Oxide-Semiconductor FETs (MOSFETs). The driver transistor 212 is selectively gated by the data signal Pdata, whereas each of the calibration transistors 213-$i$ is selectively gated by a corresponding bit i of Pcode_b. As illustrated in FIG. 2, the plurality of calibration transistors 213-$i$ are arranged in order of decreasing significance of the bit by which they are gated, from left to right. Depending on the value of Pcode_b, particular ones of the calibration transistors 213-$i$ will either allow or prevent a current from flowing therethrough. Because each calibration transistor acts as a resistor when active, changes in the value of Pcode_b have the effect of modifying the effective resistance between the high voltage VDDO and the output pad 230. Similarly, the pull-down driver 220 includes a resistor 221 and a transistor bank including a driver transistor 222 and a plurality of (here, again, five) calibration transistors 223-4 to 223-0 (collectively referred to as the calibration transistors 223-$i$). The driver transistor 222 is selectively gated by the data signal Ndata, whereas each of the calibration transistors 223-$i$ is selectively gated by a corresponding bit i of Ncode_b, thus modifying the effective resistance between the low voltage VSSO and the output pad 230. The transistors in the pull-up driver 210 are implemented as PMOS transistors, whereas the transistors in the pull-down driver 220 are implemented as NMOS transistors. The pull-up driver 210 and the pull-down driver 220 operate in a time-alternating manner, such that when the pull-up driver 210 provides a path from the high voltage VDDO to the output pad 230 the pull-down driver 220 does not provide a path from the low voltage VSSO to the output pad 230, and vice versa.

When a path is present between a particular voltage and the output pad 230, the path will have an effective resistance Rtotal which may be expressed according to the following expression (1):

$$Rtotal = Rpoly + Rmos = Rpoly + \frac{1}{\frac{\alpha\_drv}{Rdrv} + \sum_i \frac{\alpha\_i}{Rcal\_i}} \quad (1)$$

In expression (1), for the pull-up driver 210, Rpoly represents the resistance of the resistor 211, $\alpha\_drv$ is an index indicating whether the driver transistor 212 is gated or not (that is, whether Pdata is high or low), $\alpha\_i$ is an index representing whether the corresponding calibration transistor 213-$i$ is gated or not (that is, whether the bit Pcode_b<$i$> is high or low), Rdrv represents the effective resistance of the driver transistor 212, and Rcal_i represents the effective resistance of the corresponding calibration transistor 213-$i$. As can be seen from expression (i), if no path is present then $\alpha\_drv$ and $\alpha\_i$ are all zero and thus the effective resistance Rtotal is infinite.

A design parameter called the contribution ratio may be defined as CR=Rpoly/Rtotal. A high CR is desired for linearity but results in a larger physical area for the circuit components. Typically, CR may be in a range from approximately 0.5 to approximately 0.6. The quantization error E1 of a driver in operation at the fast-fast process (FF) corner is dependent on the CR, the required device width a (in μm) for operation at the FF corner, and the number of calibration code bits n. The quantization error E2 of a driver in operation at the slow-slow process (SS) corner is dependent on the CR, the required device width b (in μm) for operation at the slow-slow process (SS) corner, and the number of calibration code bits n. More specifically, the quantization errors E1 and E2 may be expressed according to the following expressions (2a) and (2b):

$$E1 = \frac{(1-CR)S}{a} \quad (2a)$$

$$E2 = \frac{(1-CR)S}{b} \quad (2b)$$

In the above expressions, the driver step size S is defined as $(b-a)/(2^n-1)$. Because b>a, E1>E2. As such, the driver variation is PVT-dependent and limited by the FF corner. In order to reduce the driver variation, it is necessary to reduce the driver step size S which is dependent on the values of a and b and is fixed for a given CR.

Thermometric Calibration

Figure 3:
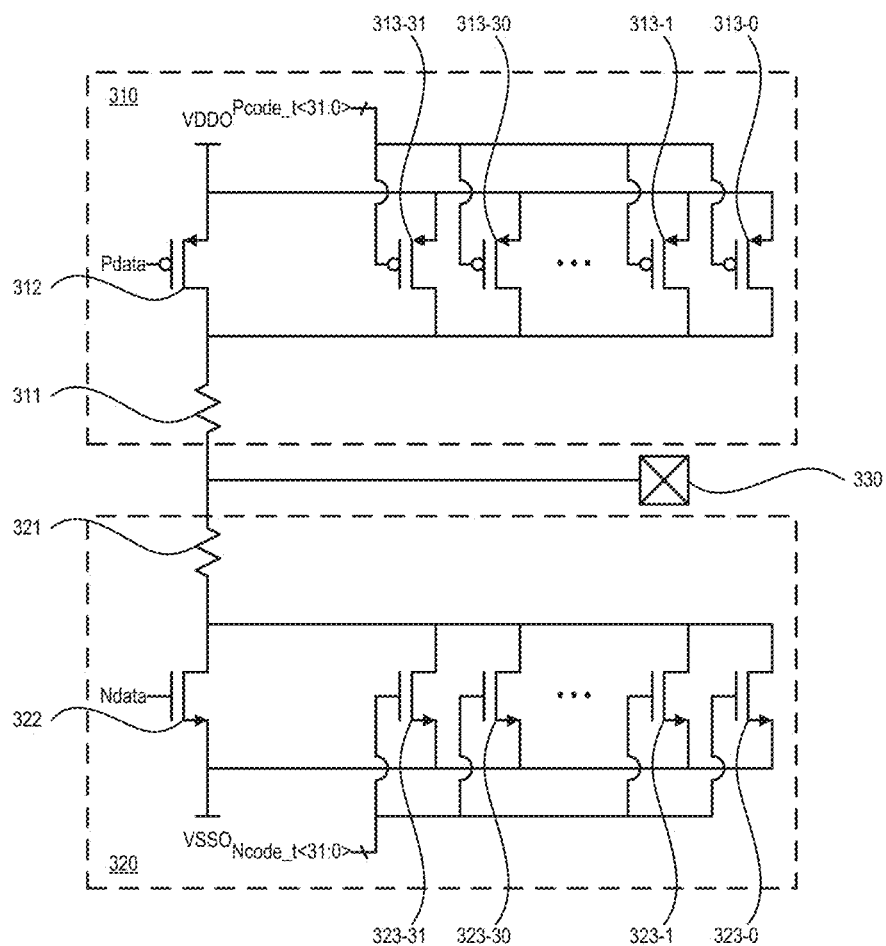
FIG. 3 illustrates a circuit diagram for a second comparative example of an IO driver.

FIG. 3 illustrates another comparative example of an IO driver, which may be implemented as the IO driver 130 of FIG. 1, where the calibration is a pure thermometric calibration. The IO driver includes a pull-up driver 310, a pull-down driver 320, and an output pad 330. The pull-up driver 310 selectively provides a path between a high voltage VDDO, such as a power source voltage, and the output pad 330 in response to a data signal Pdata and a P-leg thermometric calibration code (denoted "Pcode_t"). The pull-down driver 320 selectively provides a path between a low voltage VSSO, such as a ground voltage, and the output pad 330 in response to a data signal Ndata and an N-leg thermometric calibration code (denoted "Ncode_t"). Here, Pcode_t and Ncode_t are 32-bit thermometric codes. In general, compared to the n-bit binary calibration codes of FIG. 2, the comparative example of FIG. 3 requires a $2^n$-bit thermometric calibration code.

The pull-up driver 310 includes a resistor 311 and a transistor bank including a driver transistor 312 and a plurality of (here, thirty-two) calibration transistors 313-31 to 313-0 (collectively referred to as the calibration transistors 313-$i$). The driver transistor 312 is selectively gated by the data signal Pdata, whereas each of the calibration transistors 313-$i$ is selectively gated by a corresponding bit i of Pcode_t. Similarly, the pull-down driver 320 includes a resistor 321 and a transistor bank including a driver transistor 322 and a plurality of (here, again, thirty-two) calibration transistors 323-31 to 323-0 (collectively referred to as the calibration transistors 323-$i$). The driver transistor 322 is selectively gated by the data signal Ndata, whereas each of the calibration transistors 323-$i$ is selectively gated by a corresponding bit i of Ncode_t. The transistors in the pull-up driver 310 are implemented as PMOS transistors, whereas the transistors in the pull-down driver 320 are implemented as NMOS transistors. The pull-up driver 310 and the pull-down driver 320 operate in a time-alternating manner, such that when the pull-up driver 310 provides a path from the high voltage VDDO to the output pad 330 the pull-down driver 320 does not provide a path from the low voltage VSSO to the output pad 330, and vice versa.

As compared to the comparative example of FIG. 2, the comparative example of FIG. 3 allows for greater control of quantization error over PVT variations because each step has its own weight (that is, contribution to effective resistance) due to the individual parameters of the corresponding calibration transistor. However, the logic required to achieve acceptable performance can be large. For example, as compared to the 5-transistor binary implementation, the thermometric implementation of FIG. 3 requires thirty-two transistors per leg. This implementation requires a very large silicon area. Moreover, because the thermometric calibration code has 32 bits, the calibration time may become long.

Hybrid Calibration—1 MSB

Figure 4:
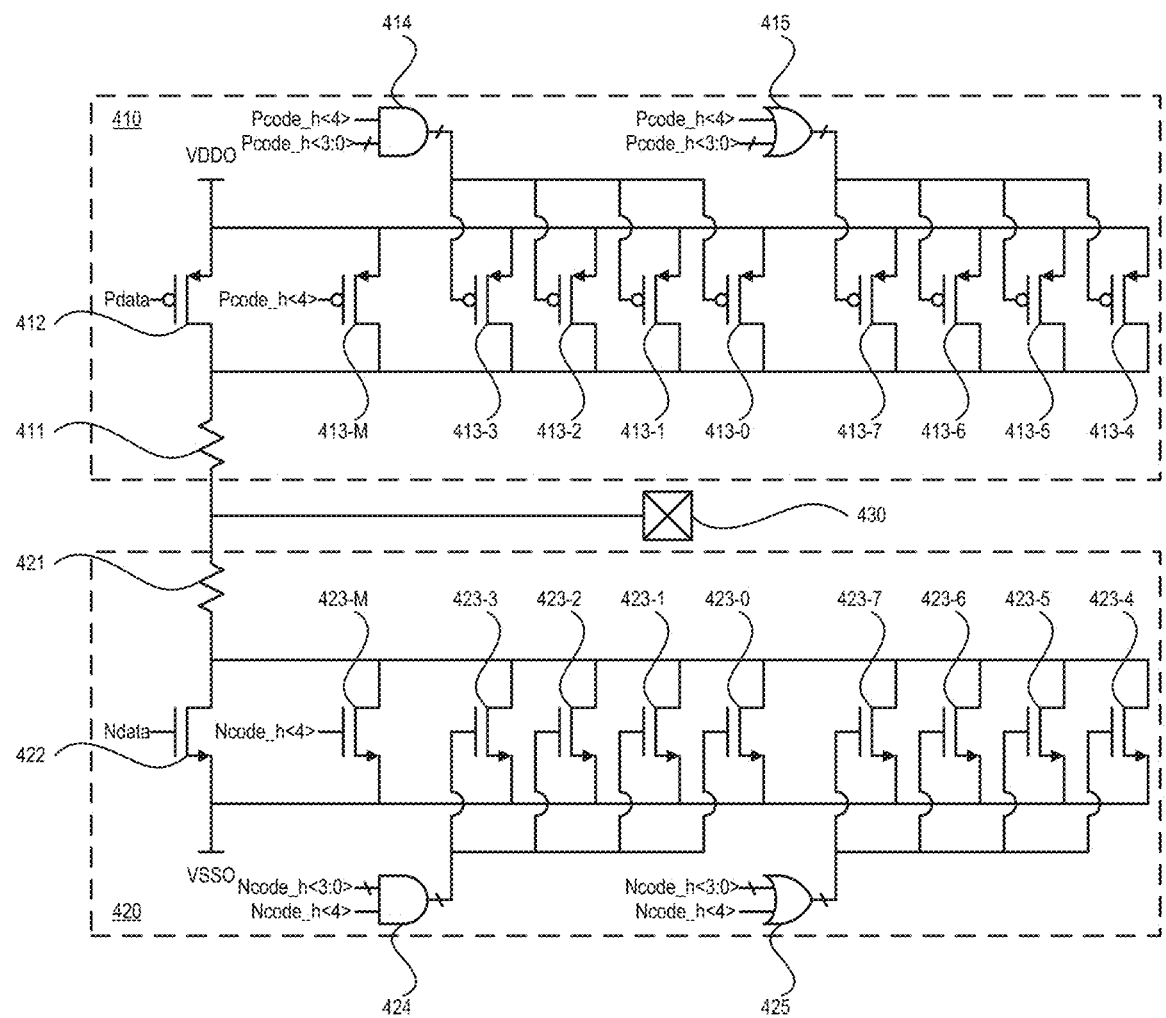
FIG. 4 illustrates a circuit diagram for an exemplary IO driver according to various aspects of the present disclosure.

In order to control the variation of driver impedance across PVT variations with an acceptable silicon footprint and calibration time, a hybrid calibration implementation may be used. FIG. 4 illustrates an exemplary IO driver which utilizes a hybrid calibration implementation. The IO driver of FIG. 4 may be implemented as the IO driver 130 of FIG. 1.

The IO driver includes a pull-up driver 410, a pull-down driver 420, and an output pad 430. The pull-up driver 410 selectively provides a path between a high voltage VDDO, such as a power source voltage, and the output pad 430 in response to a data signal Pdata and a P-leg hybrid calibration code (denoted "Pcode_h"). The pull-down driver 420 selectively provides a path between a low voltage VSSO, such as a ground voltage, and the output pad 430 in response to a data signal Ndata and an N-leg hybrid calibration code (denoted "Ncode_h"). As illustrated in FIG. 4, Pcode_h and Ncode_h are 5-bit hybrid codes corresponding to a 1-bit thermometric portion and a 4-bit binary portion. However, calibration codes having a different number of bits may be used.

The pull-up driver 410 includes a resistor 411 and a transistor bank including a driver transistor 412 and a plurality of (here, nine) calibration transistors 413-M and 413-7 to 413-0 (collectively referred to as the calibration transistors 413-$i$). The driver transistor 412 is selectively gated by the data signal Pdata. The calibration transistor 413-M is selectively gated by the most significant bit (MSB) of Pcode_h, which is the bit Pcode_h<4>. The calibration transistors 413-3 to 413-0 are selectively gated by a logical AND combination of the MSB of Pcode_h with the least significant bits (LSBs) of Pcode_h. That is, the calibration transistor 413-3 is selectively gated by a logical AND combination of the bit Pcode_h <4> and the bit Pcode_h <3>, the calibration transistor 413-2 is selectively gated by a logical AND combination of the bit Pcode_h <4> and the bit Pcode_h <2>, and so on. The control signals for the calibration transistors 413-3 to 413-0 are output from an AND gate 414 which receives the bit Pcode_h <4> at a first input terminal and the bits Pcode_h <3:0> at a plurality of second input terminals. The calibration transistors 413-7 to 413-4 are selectively gated by a logical OR combination of the MSB of Pcode_h with the LSBs of Pcode_h. That is, the calibration transistor 413-7 is selectively gated by a logical OR combination of the bit Pcode_h <4> and the bit Pcode_h <3>, the calibration transistor 413-6 is selectively gated by a logical OR combination of the bit Pcode_h <4> and the bit Pcode_h <2>, and so on. The control signals for the calibration transistors 413-7 to 413-4 are output from an OR gate 415 which receives the bit Pcode_h <4> at a first input terminal and the bits Pcode_h <3:0> at a plurality of second input terminals.

The pull-down driver 420 includes a resistor 421 and a transistor bank including a driver transistor 422 and a plurality of (here, nine) calibration transistors 423-M and 423-7 to 423-0 (collectively referred to as the calibration transistors 423-i). The driver transistor 422 is selectively gated by the data signal Ndata. The calibration transistor 423-M is selectively gated by the MSB of Ncode_h, which is the bit Ncode_h <4>. The calibration transistors 423-3 to 423-0 are selectively gated by a logical AND combination of the MSB of Ncode_h with the LSBs of Ncode_h. That is, the calibration transistor 423-3 is selectively gated by a logical AND combination of the bit Ncode_h <4> and the bit Ncode_h <3>, the calibration transistor 423-2 is selectively gated by a logical AND combination of the bit Ncode_h <4> and the bit Ncode_h <2>, and so on. The control signals for the calibration transistors 423-3 to 423-0 are output from an AND gate 424 which receives the bit Ncode_h <4> at a first input terminal and the bits Ncode_h <3:0> at a plurality of second input terminals. The calibration transistors 423-7 to 423-4 are selectively gated by a logical OR combination of the MSB of Ncode_h with the LSBs of Ncode_h. That is, the calibration transistor 423-7 is selectively gated by a logical OR combination of the bit Ncode_h <4> and the bit Ncode_h <3>, the calibration transistor 423-6 is selectively gated by a logical OR combination of the bit Ncode_h <4> and the bit Ncode_h <2>, and so on. The control signals for the calibration transistors 423-7 to 423-4 are output from an OR gate 425 which receives the bit Ncode_h <4> at a first input terminal and the bits Ncode_h <3:0> at a plurality of second input terminals.

In operation, the pull-up driver 410 and the pull-down driver 420 are composed of two parts. When the design is near the FF corner (that is, when the MSBs Pcode_h <4>=1 and Ncode_h <4>=0), the calibration transistors 412 and 413-3 to 413-0 take part in the calibration of the pull-up driver 410 and the calibration transistors 422 and 423-7 to 423-4 take part in the calibration of the pull-down driver 420. Additional calibration transistors (413-M and 413-7 to 413-4 for the pull-up transistor 410; 423-M and 423-3 to 423-0 for the pull-down transistor 420) become active signifying that the process corner is slow. Thus, the step size can be chosen independently in the FF and SS corners, distinguished by the value of the MSB of the hybrid calibration codes.

Given the notation above for the contribution ratio CR, the required device width a for operation at the FF corner, the required device width b for operation at the SS corner and the number of calibration code bits n, and expanding the definition of driver step size to be S1 when the MSB of the hybrid calibration code is inactive and S2 when the MSB of the hybrid calibration code is active, the device width b may be expressed according to the following expression (3):

$$b = a + (S1+S2)2^{n-1} - S1 \qquad (3)$$

Thus, the quantization errors E1 and E2 may be expressed according to the following expressions (4a) and (4b):

$$E1 = \frac{(1-CR)S1}{a} \qquad (4a)$$

$$E2 = \frac{(1-CR)S2}{a+(2^{n-1}-1)S1} \qquad (4b)$$

A step ratio SR may be defined as S2/S1. Solving expressions (3) and (4a)-(4b) together, the following expressions (5) and (6) may be derived:

$$SR = 1 + \frac{(2^{n-1}-1)S1}{a} \qquad (5)$$

$$S1 = \frac{\sqrt{a+b(2+2^n)2^n} - a(2^n+1)}{2^n(2^n+1)} \qquad (6)$$

The IO driver illustrated in FIG. 4 with single-point correction may be implemented in a 65 nm and a 16 nm design. The contribution of quantization error is reduced from 3.7% (provided by the comparative example of FIG. 2) to 2.4%, a 1.5× gain. This is achieved without any overhead on the performance of the output link (which is present in the comparative example of FIG. 3).

Figure 5:
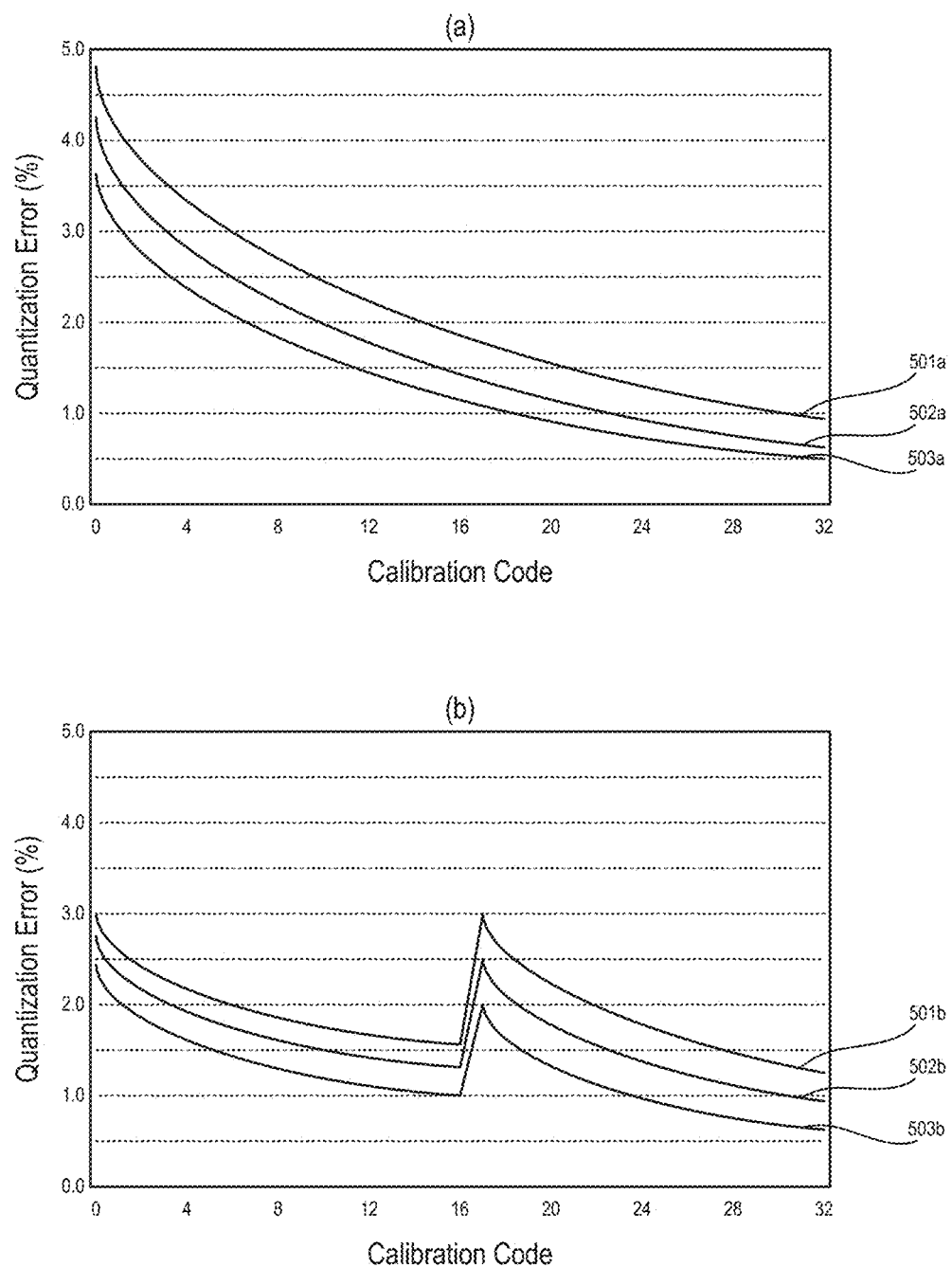
FIG. 5 illustrates an exemplary comparison of quantization error for the IO driver according to FIG. 2 with the IO driver according to FIG. 4.

FIG. 5 illustrates a comparison of the quantization error over PVT variations for the binary calibration illustrated in FIG. 2, shown as graph (a), and the hybrid calibration illustrated in FIG. 4, shown as graph (b). For both graphs (a) and (b), the vertical axis indicates the quantization error expressed as a percentage and the horizontal axis indicates the calibration code value. In graph (a), curve 501a represents the SS corner, curve 502a represents the typical-typical process (TT) corner, and curve 503a represents the FF corner. In graph (b), curve 501b represents the SS corner, curve 502b represents the TT corner, and curve 503b represents the FF corner. In graph (a), the quantization error varies monotonically with respect to changes in the calibration code. As such, the quantization error has a large variance, from approximately 3.7% (FF corner, calibration code 0) to approximately 0.9% (SS corner, calibration code 31). In graph (b), the quantization error is subject to both coarse and fine control. That is, when the MSB of the hybrid calibration code is changed, there is a relatively abrupt change in the quantization error. This results in a significantly reduced variance in the quantization error, from approximately 2.4% (FF corner, calibration code 0) to approximately 1.2% (SS corner, calibration code 31).

The IO driver of FIG. 4, which uses the MSB of a 5-bit hybrid calibration code, may be generalized to an n-bit hybrid calibration code. In this generalization, for each leg of the IO driver (pull-up or pull-down), the plurality of calibration transistors will include one calibration transistor that is selectively gated by the MSB of the n-bit hybrid calibration code (similar to the calibration transistor 413-M and the calibration transistor 423-M of FIG. 4), n−1 calibration transistors that are selectively gated by a logical AND combination (similar to the calibration transistors 413-3 to 413-0 and the calibration transistors 423-3 to 423-0 of FIG. 4), and n−1 calibration transistors that are selectively gated by a logical OR combination (similar to the calibration transistors 413-7 to 413-4 and the calibration transistors 423-7 to 423-4 of FIG. 4). The total number of transistors for each leg of the IO driver is 1+2(n−1).

While FIG. 4 illustrates a logic circuit including the AND gates 414 and 424 and the OR gates 415 and 425 as being constituent parts of the pull-up driver 410 and the pull-down driver 420, respectively, in practice the logic circuit may be provided external to the IO driver. Moreover, while FIG. 4 illustrates the logic gates implemented as single gates, in practice the logic gates may be formed by a combination of gates. For example, the AND gate 414 or the AND gate 424 may each be implemented as a pair of NAND gates or a plurality of NOR gates to perform the logical conjunction. Moreover, the OR gate 415 or the OR gate 425 may each be implemented as a pair of NOR gates or a plurality of NAND gates to perform the logical disjunction. So long as the logic circuit varies the impedances of the pull-up driver 410 and the pull-down driver 420 based on bits Pcode_h and Ncode_h, respectively, hybrid calibration of the IO driver will be realized.

FIG. 4 illustrates the transistors in the pull-up driver 410 implemented as PMOS transistors and the transistors in the pull-down driver 420 implemented as NMOS transistors. Alternatively, each of the transistors in the IO driver may be implemented using the same conductivity type, either PMOS or NMOS. If this is used, then Pcode_h should be an inversion of Ncode_h, or vice versa. In either configuration, the pull-up driver 410 and the pull-down driver 420 operate in a time-alternating manner, such that when the pull-up driver 410 provides a path from the high voltage VDDO to the output pad 430 the pull-down driver 420 does not provide a path from the low voltage VSSO to the output pad 430, and vice versa.

As compared to the comparative example of FIG. 2, the implementation illustrated in FIG. 4 provides greater control of quantization error over PVT variations with only a small (~5%, for example) increase in required silicon area and substantially the same calibration time. Thus, as compared to the comparative example of FIG. 3, the implementation illustrated in FIG. 4 requires a reduced silicon area and a shortened calibration time.

Hybrid Calibration—Multiple MSB

While FIG. 4 illustrates a hybrid calibration implementation where only the single MSB is used as a thermometric portion, the present disclosure may be expanded to use multiple MSBs as the thermometric portion. In general, the n-bit Pcode_h and Ncode_h may be implemented as an K-bit thermometric portion and an L-bit binary portion, where K is a positive integer representing the number of MSBs used, L is a positive integer representing the number of LSBs used, and n=K+L. K may be the same as or different than L; however, K is preferably smaller than L for reasons which will be described in more detail below.

Figure 6:
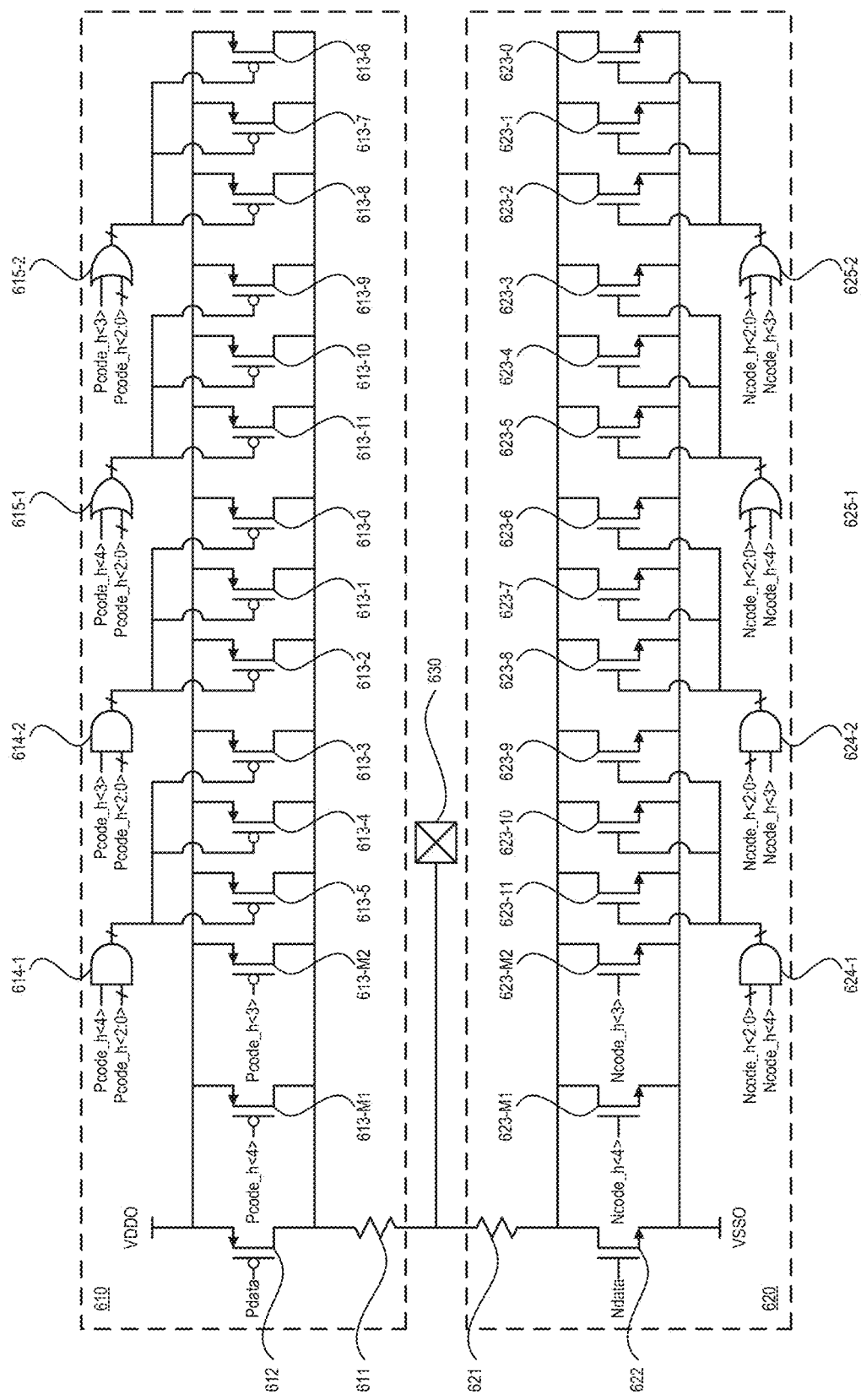
FIG. 6 illustrates a circuit diagram for another exemplary IO driver according to various aspects of the present disclosure.
Figure 7:
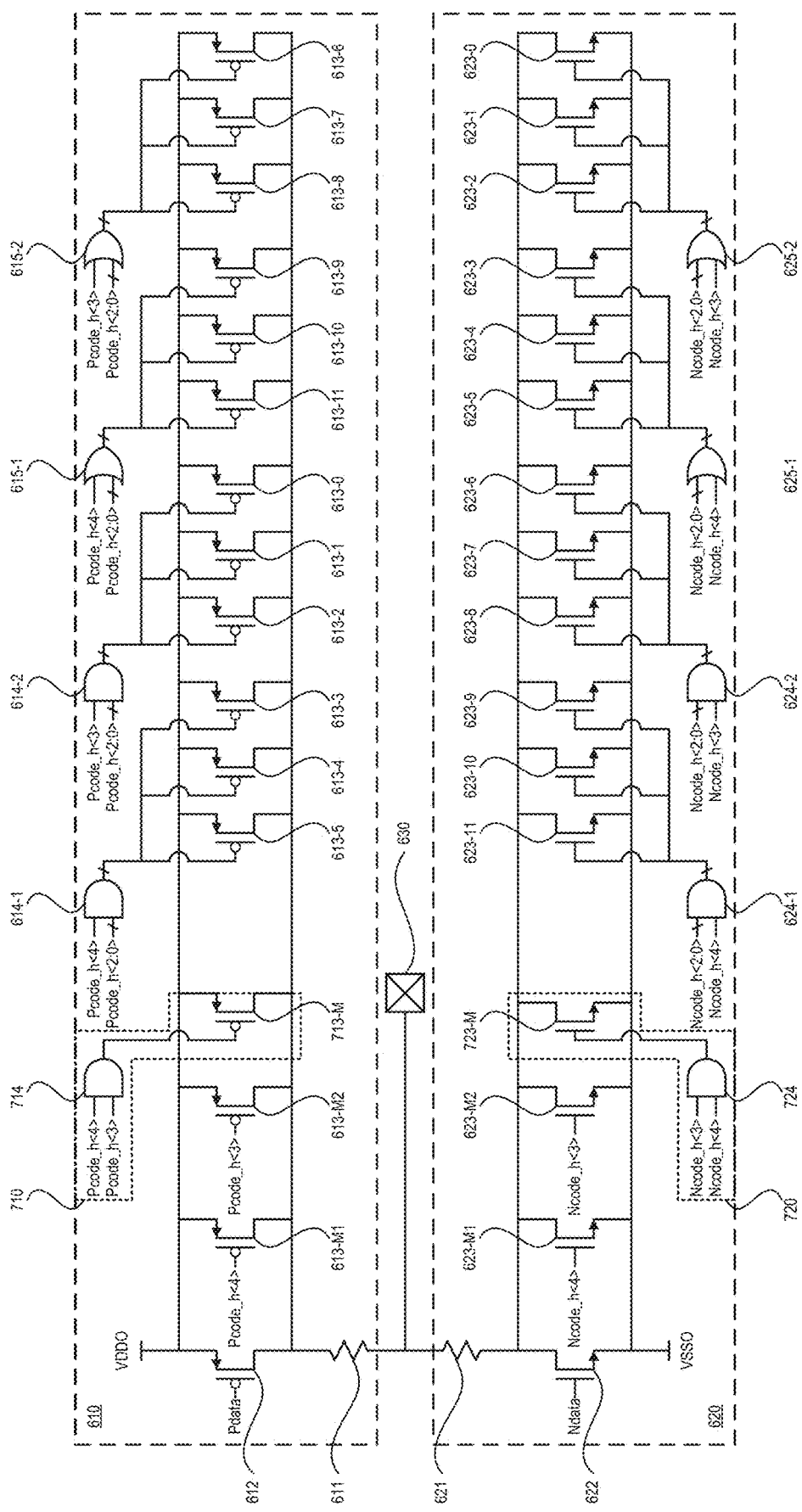
FIG. 7 illustrates a circuit diagram for an exemplary modification to the IO driver according to FIG. 6.
Figure 8:
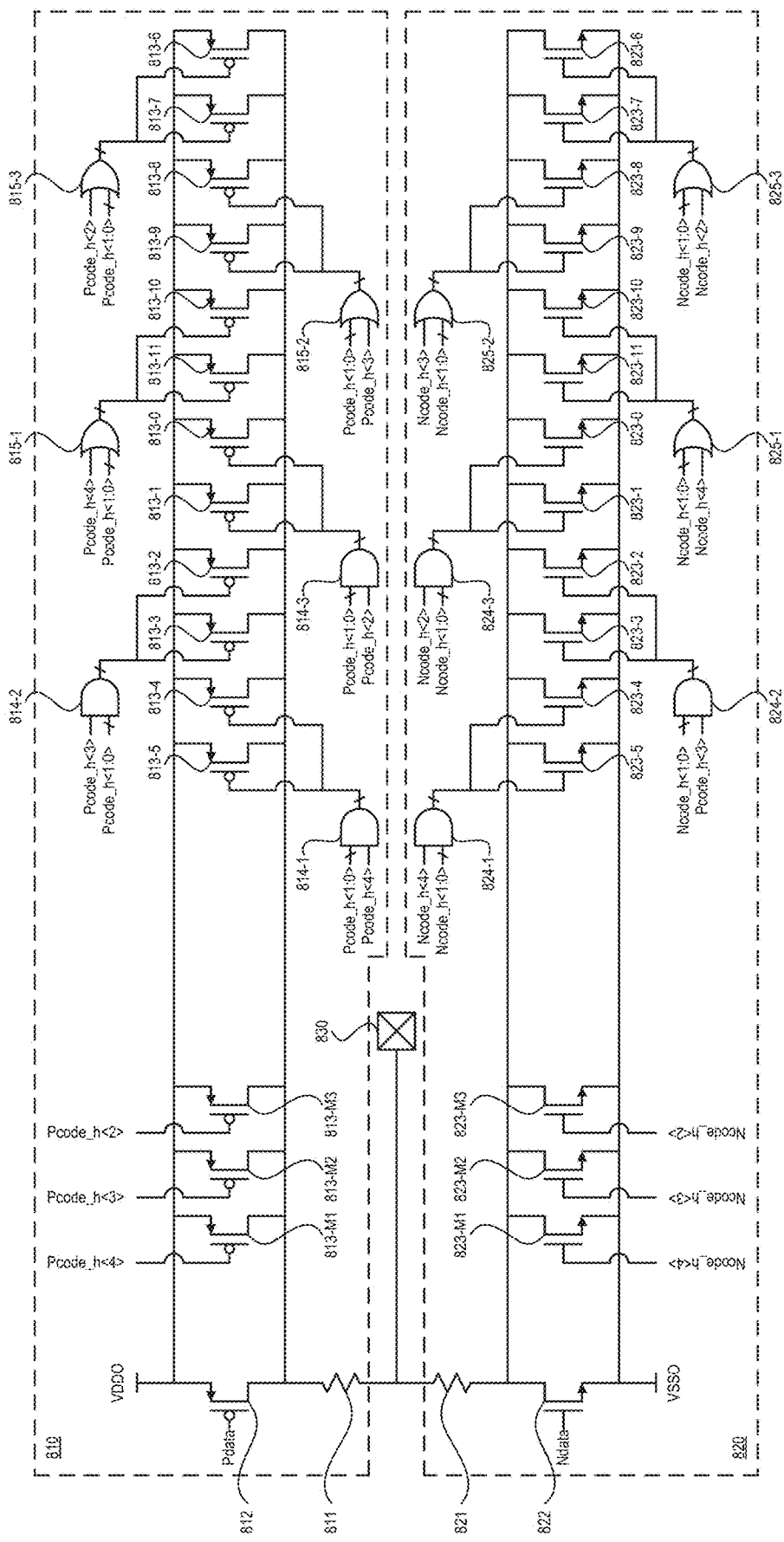
FIG. 8 illustrates a circuit diagram for another exemplary IO driver according to various aspects of the present disclosure.
Figure 9:
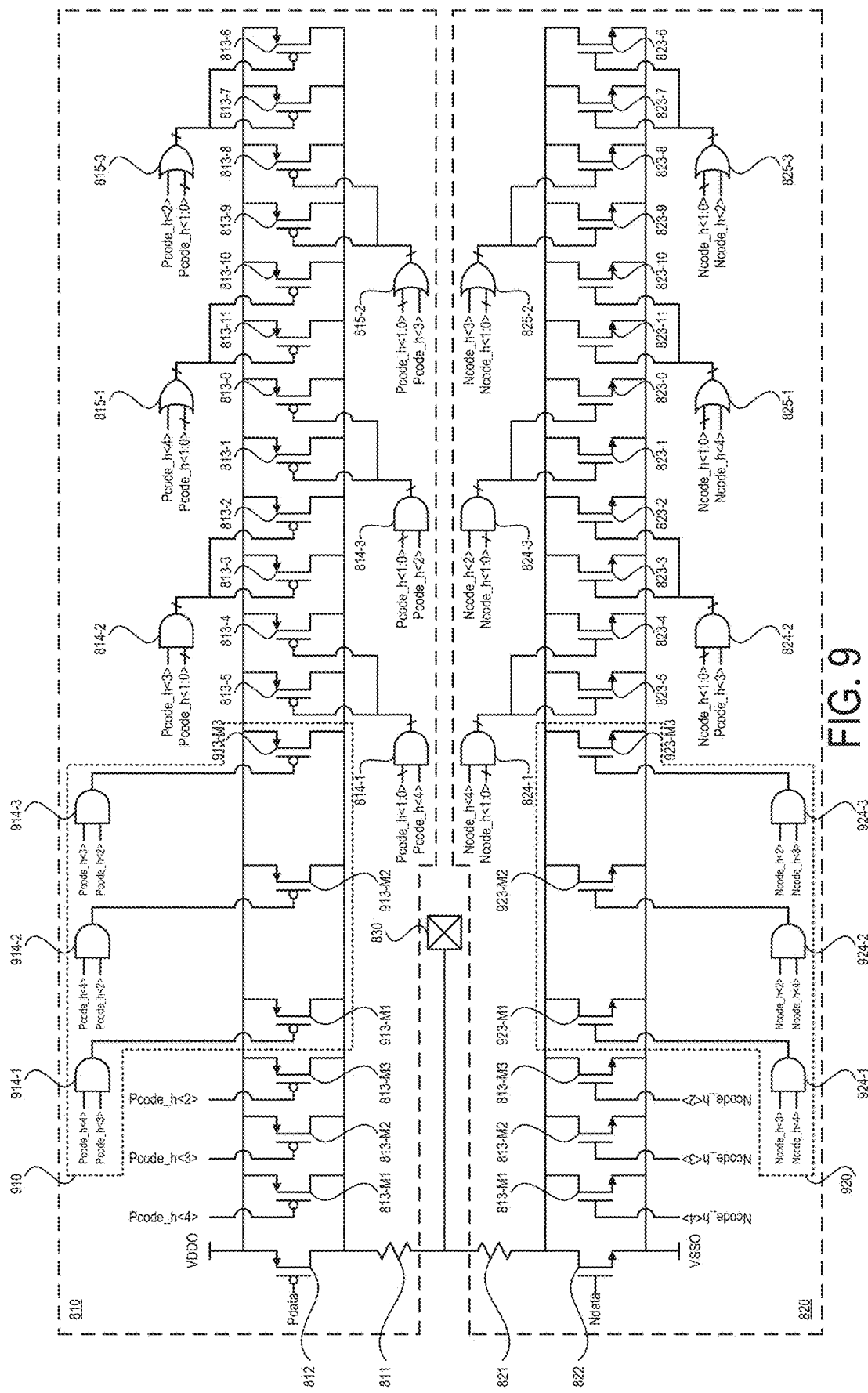
FIG. 9 illustrates a circuit diagram for an exemplary modification to the IO driver according to FIG. 8.

FIGS. 6-7 illustrate exemplary IO drivers which utilize a hybrid calibration implementation where K=2 and L=3, and FIG. 8-9 illustrate exemplary IO drivers which utilize a hybrid calibration implementation where K=3 and L=2. The exemplary IO drivers of FIGS. 6-9 may be implemented as the IO driver 130 of FIG. 1.

The IO driver illustrated in FIG. 6 includes a pull-up driver 610, a pull-down driver 620, and an output pad 630. The pull-up driver 610 selectively provides a path between a high voltage VDDO, such as a power source voltage, and the output pad 630 in response to a data signal Pdata and Pcode_h. The pull-down driver 620 selectively provides a path between a low voltage VSSO, such as a ground voltage, and the output pad 630 in response to a data signal Ndata and Ncode_h. As illustrated in FIG. 6, Pcode_h and Ncode_h are 5-bit hybrid codes corresponding to a 2-bit thermometric portion and a 3-bit binary portion.

The pull-up driver 610 includes a resistor 611 and a transistor bank including a driver transistor 612 and a plurality (here, fourteen) calibration transistors 613-M1 to 613-M2 and 613-11 to 613-0 (collectively referred to as the calibration transistors 613-$i$). The driver transistor 612 is selectively gated by the data signal Pdata. The calibration transistor 613-M1 is selectively gated by the most significant bit (1MSB) of Pcode_h, which is the bit Pcode_h <4>. The calibration transistor 613-M2 is selectively gated by the second-most significant bit (2MSB) of Pcode_h, which is the bit Pcode_h <3>. The calibration transistors 613-5 to 613-3 are selectively gated by a logical AND combination of the 1MSB of Pcode_h with the LSBs of Pcode_h. The calibration transistors 613-3 to 613-0 are selectively gated by a logical AND combination of the 2MSB of Pcode_h with the LSBs of Pcode_h. The control signals for the calibration transistors 613-5 to 613-0 are output from AND gates 614-1 and 614-2. The calibration transistors 613-11 to 613-9 are selectively gated by a logical OR combination of the 1MSB of Pcode_h with the LSBs of Pcode_h. The calibration transistors 613-8 to 613-6 are selectively gated by a logical OR combination of the 2MSB of Pcode_h with the LSBs of Pcode_h. The control signals for the calibration transistors 613-11 to 613-6 are output from OR gates 615-1 and 615-2.

The pull-down driver 620 includes a resistor 621 and a transistor bank including a driver transistor 622 and a plurality (here, fourteen) calibration transistors 623-M1 to 623-M2 and 623-11 to 623-0 (collectively referred to as the calibration transistors 623-$i$). The driver transistor 622 is selectively gated by the data signal Ndata. The calibration transistor 623-M1 is selectively gated by the 1MSB of Ncode_h, which is the bit Ncode_h <4>. The calibration transistor 623-M2 is selectively gated by the 2MSB of Ncode_h, which is the bit Ncode_h <3>. The calibration transistors 623-5 to 623-3 are selectively gated by a logical AND combination of the 1MSB of Ncode_h with the LSBs of Ncode_h. The calibration transistors 623-3 to 623-0 are selectively gated by a logical AND combination of the 2MSB of Ncode_h with the LSBs of Ncode_h. The control signals for the calibration transistors 623-5 to 623-0 are output from AND gates 624-1 and 624-2. The calibration transistors 623-11 to 623-9 are selectively gated by a logical OR combination of the 1MSB of Ncode_h with the LSBs of Ncode_h. The calibration transistors 623-8 to 623-6 are selectively gated by a logical OR combination of the 2MSB of Ncode_h with the LSBs of Ncode_h. The control signals for the calibration transistors 623-11 to 623-8 are output from OR gates 625-1 and 625-2.

FIG. 7 illustrates a modification to the IO driver illustrated in FIG. 6 in which an additional calibration transistor bank 710 is included in the pull-up driver 610 and an additional calibration transistor bank 720 is included in the pull-up driver 620. The additional calibration transistor bank 710 includes an additional calibration transistor 713-M and an AND gate 714 which receives the 1MSB of Pcode_h at a first input and the 2MSB of Pcode_h at a second input. The additional calibration transistor bank 720 includes an additional calibration transistor 723-M and an AND gate 724 which receives the 1MSB of Ncode_h at a first input and the 2MSB of Ncode_h at a second input. The additional calibration transistor banks 710 and 720 provide an additional level of coarse control over the driver impedance spread at the cost of an increased silicon footprint. However, the inclusion of the additional calibration transistor banks 710 and 720 may allow for the weights of the remaining calibration transistors (especially the calibration transistors 613-

M1, 613-M2, 623-M1, and 623-M2) to be modified such that the overall silicon footprint of the IO driver remains acceptable.

The IO driver illustrated in FIG. 8 includes a pull-up driver 810, a pull-down driver 820, and an output pad 830. The pull-up driver 810 selectively provides a path between a high voltage VDDO, such as a power source voltage, and the output pad 830 in response to a data signal Pdata and Pcode_h. The pull-down driver 820 selectively provides a path between a low voltage VSSO, such as a ground voltage, and the output pad 830 in response to a data signal Ndata and Ncode_h. As illustrated in FIG. 8, Pcode_h and Ncode_h are 5-bit hybrid codes corresponding to a 3-bit thermometric portion and a 2-bit binary portion.

The pull-up driver 810 includes a resistor 811 and a transistor bank including a driver transistor 812 and a plurality (here, fifteen) calibration transistors 813-M1 to 813-M3 and 813-11 to 813-0 (collectively referred to as the calibration transistors 813-$i$). The driver transistor 812 is selectively gated by the data signal Pdata. The calibration transistor 813-M1 is selectively gated by the 1MSB of Pcode_h, which is the bit Pcode_h <4>. The calibration transistor 813-M2 is selectively gated by the 2MSB of Pcode_h, which is the bit Pcode_h <3>. The calibration transistor 813-M3 is selectively gated by the third-most significant bit (3MSB) of Pcode_h, which is the bit Pcode_h <2>. The calibration transistors 813-5 and 813-4 are selectively gated by a logical AND combination of the 1MSB of Pcode_h with the LSBs of Pcode_h. The calibration transistors 813-3 and 813-2 are selectively gated by a logical AND combination of the 2MSB of Pcode_h with the LSBs of Pcode_h. The calibration transistors 813-1 and 813-0 are selectively gated by a logical AND combination of the 3MSB of Pcode_h with the LSBs of Pcode_h. The control signals for the calibration transistors 813-5 to 813-0 are output from AND gates 814-1 to 814-3. The calibration transistors 813-11 and 813-10 are selectively gated by a logical OR combination of the 1MSB of Pcode_h with the LSBs of Pcode_h. The calibration transistors 813-9 and 813-8 are selectively gated by a logical OR combination of the 2MSB of Pcode_h with the LSBs of Pcode_h. The calibration transistors 813-7 and 813-6 are selectively gated by a logical OR combination of the 3MSB of Pcode_h with the LSBs of Pcode_h. The control signals for the calibration transistors 813-11 to 813-6 are output from OR gates 815-1 to 815-3.

The pull-down driver 820 includes a resistor 821 and a transistor bank including a driver transistor 822 and a plurality (here, fifteen) calibration transistors 823-M1 to 823-M3 and 823-11 to 823-0 (collectively referred to as the calibration transistors 823-$i$). The driver transistor 822 is selectively gated by the data signal Ndata. The calibration transistor 823-M1 is selectively gated by the 1MSB of Ncode_h, which is the bit Ncode_h <4>. The calibration transistor 823-M2 is selectively gated by the 2MSB of Ncode_h, which is the bit Ncode_h <3>. The calibration transistor 823-M3 is selectively gated by the 3MSB of Ncode_h, which is the bit Ncode_h <2>. The calibration transistors 823-3 and 823-2 are selectively gated by a logical AND combination of the 2MSB of Ncode_h with the LSBs of Ncode_h. The calibration transistors 823-1 and 823-0 are selectively gated by a logical AND combination of the 3MSB of Ncode_h with the LSBs of Ncode_h. The control signals for the calibration transistors 823-5 to 823-0 are output from AND gates 824-1 to 824-3. The calibration transistors 823-11 and 823-10 are selectively gated by a logical OR combination of the 1MSB of Ncode_h with the LSBs of Ncode_h. The calibration transistors 823-9 and 823-8 are selectively gated by a logical OR combination of the 2MSB of Ncode_h with the LSBs of Ncode_h. The calibration transistors 823-7 and 823-6 are selectively gated by a logical OR combination of the 3MSB of Ncode_h with the LSBs of Ncode_h. The control signals for the calibration transistors 823-11 to 823-6 are output from OR gates 825-1 to 825-3.

FIG. 9 illustrates a modification to the IO driver illustrated in FIG. 8 in which an additional calibration transistor bank 910 is included in the pull-up driver 810 and an additional calibration transistor bank 920 is included in the pull-up driver 820. The additional calibration transistor bank 910 includes additional calibration transistors 913-M1 to 913-M3 and AND gates 914-1 to 914-3. The AND gates 914-1 to 914-3 perform each possible AND combination of the three MSBs of Pcode_h. The additional calibration transistor bank 920 includes an additional calibration transistors 923-M1 to 923-M2 and AND gates 924-1 to 924-3. The AND gates 924-1 to 924-3 perform each possible AND combination of the three MSBs of Ncode_h. The additional calibration transistor banks 910 and 920 provide an additional level of coarse control over the driver impedance spread, but with an increased silicon footprint. However, the inclusion of the additional calibration transistor banks 910 and 920 may allow for the weights of the remaining calibration transistors (especially the calibration transistors 813-M1 to 813-M3 and 823-M1 to 823-M3) to be modified such that the overall silicon footprint of the IO driver remains acceptable.

The IO drivers of FIGS. 6-9, which use the two or three MSB of a 5-bit hybrid calibration code, may be generalized to use the K MSB and L MSB of an n-bit hybrid calibration code, where n=K+L. Thus, for each leg of the IO driver (pull-up or pull-down), the plurality of calibration transistors will include K calibration transistors that are selectively gated by corresponding ones of the L MSB of the n-bit hybrid calibration code; K×L calibration transistors that are selectively gated by logical AND combinations of each of the K MSB of the n-bit hybrid calibration code with each of the L LSB of the n-bit hybrid calibration code; K×L calibration transistors that are selectively gated by logical OR combinations of each of the K MSB of the n-bit hybrid calibration code with each of the L LSB of the n-bit hybrid calibration code; and, if the additional calibration transistor banks are utilized as shown in FIGS. 7 and 9, $(K^2-K)/2$ calibration transistors that are selectively gated by logical AND combinations of each of the K MSB of the n-bit hybrid calibration code with each remaining MSB. The total number of transistors for each leg of the IO driver is K(1+2L) if the additional calibration transistor banks are omitted, or K(1+2L+(K−1)/2) if the additional calibration transistor banks are utilized. As such, as a larger number of MSBs is used for the thermometric portion, more total transistors are required. This may result in an increase in silicon area and/or calibration time required, but may result in an improved reduction in driver impedance spread. In implementations where large increases in silicon area and/or calibration time are unacceptable (for example, in very small and/or high-speed circuits), it is preferable to have a small value for K and a comparatively large value for L.

While FIGS. 6-9 illustrate logic circuits including the AND gates and the OR gates as being constituent parts of the pull-up driver and the pull-down driver, respectively, in practice the logic circuits may be provided external to the IO driver. Moreover, while FIGS. 6-9 illustrate the logic gates implemented as single gates, in practice the logic gates may be formed by a combination of gates. For example, the AND gates may each be implemented as a pair of NAND gates or a plurality of NOR gates to perform the logical conjunction. Moreover, the OR gates may each be implemented as a pair of NOR gates or a plurality of NAND gates to perform the logical disjunction.

Furthermore, while FIGS. 6-9 illustrate the transistors in the various pull-up drivers implemented as PMOS transistors and the transistors in the various pull-down drivers implemented as NMOS transistors, each of the transistors in the IO driver may be implemented using the same conductivity type, either PMOS or NMOS. If this is used, then Pcode_h should be an inversion of Ncode_h, or vice versa. In either configuration, the pull-up driver and the pull-down driver operate in a time-alternating manner, such that when the pull-up driver provides a path from the high voltage VDDO to the output pad the pull-down driver does not provide a path from the low voltage VSSO to the output pad, and vice versa.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less all features of a single disclosed embodiment. Thus the following claims are hereby incorporated into the Detailed Description, with each claim standing on its own as a separately claimed subject matter.

What is claimed is:

1. A circuit, comprising:
   a first driver including a first transistor bank connected between a first predetermined voltage and an output pad, the first transistor bank including a first driver transistor, a first primary calibration transistor, and a plurality of first secondary calibration transistors,
   wherein a data signal controls the first driver transistor, and
   wherein a most significant bit of a first calibration code controls the first primary calibration transistor, the first calibration code having a plurality of bits consisting of K most significant bits and L least significant bits,
   wherein an output of at least one first logic gate controls the plurality of first secondary calibration transistors, a respective first logic gate receiving the most significant bit of the first calibration code and at least one of the least significant bits of the first calibration code, and
   wherein K and L are positive integers.

2. The circuit according to claim 1, wherein the K most significant bits of the first calibration code are a thermometric code and the L least significant bits of the first calibration code are a binary code.

3. The circuit according to claim 1, wherein K is one.

4. The circuit according to claim 3, wherein the at least one first logic gate includes:
   an AND gate configured to receive the most significant bit of the first calibration code at a first input and the L least significant bits of the first calibration code respectively at L second inputs, and to output a first control code to a first subset of the plurality of first secondary calibration transistors; and
   an OR gate configured to receive the most significant bit of the first calibration code at a first input and the L least significant bits of the first calibration code respectively at L second inputs, and to output a second control code to a second subset of the plurality of first secondary calibration transistors.

5. The circuit according to claim 1, further comprising:
   a second driver including a second transistor bank and a second resistor connected in series between a second predetermined voltage and the output pad, the second transistor bank including a second driver transistor, a second primary calibration transistor and a plurality of second secondary calibration transistors,
   wherein the second primary calibration transistor and the plurality of second secondary calibration transistors are respectively controlled based on a second calibration code having K most significant bits and L least significant bits and on an output of at least one second logic gate.

6. The circuit according to claim 5, wherein the plurality of first secondary calibration transistors have a first conductivity type and the plurality of second secondary calibration transistors have a second conductivity type opposite the first conductivity type.

7. The circuit according to claim 5, wherein the second calibration code is an inversion of the first calibration code.

8. A system, comprising:
   a memory array; and
   an IO driver circuit configured to output a signal to the memory array, the IO driver circuit including:
      a first driver including a first transistor bank and a first resistor connected in series between a first predetermined voltage and an output pad, the first transistor bank including a first driver transistor and a plurality of first calibration transistors, the plurality of first calibration transistors including a main calibration transistor, a second driver including a second transistor bank and a second resistor connected in series between a second predetermined voltage and the output pad, the second transistor bank including a second driver transistor and a plurality of second calibration transistors, a data signal source configured to control the first driver transistor with a data signal, a calibration signal source configured to control the main calibration transistor with a most significant bit of a first calibration code, the first calibration code consisting of K most significant bits and L least significant bits, and a logic gate configured to vary an impedance of the first driver based on bits of the first calibration code, and to vary an impedance of the second driver based on bits of a second calibration code.

9. The system according to claim 8, wherein the K most significant bits of the first calibration code are a thermometric code and the L least significant bits of the first calibration code are a binary code, where K and L are positive integers.

10. The system according to claim 9, wherein K is one.

11. The system according to claim 10, wherein the logic gate is part of a logic circuit that is configured to:

vary an impedance of a first subset of the plurality of first calibration transistors based on at least one AND operation respectively between the most significant bit of the first calibration code and the L least significant bits of the first calibration code, and vary an impedance of a second subset of the plurality of first calibration transistors based on at least one OR operation respectively between the most significant bit of the first calibration code and the L least significant bits of the first calibration code, wherein the first subset and the second subset do not include the main calibration transistor.

12. The system according to claim 8, wherein the plurality of first calibration transistors is a plurality of p-type transistors and the plurality of second calibration transistors is a plurality of n-type transistors.

13. The system according to claim 8, further comprising an inverter configured to receive the first calibration code and generate the second calibration code.

14. A method, comprising:

selectively providing, by a pull-up driver, a path between a first predetermined voltage and an output pad by controlling a first transistor bank and a first resistor connected in series therebetween, the first transistor bank including a first driver transistor, a first calibration transistor, and a plurality of second calibration transistors;

selectively providing, by a pull-down driver, a path between a second predetermined voltage and the output pad by controlling a second transistor bank and a second resistor connected in series therebetween, the second transistor bank including a second driver transistor and a plurality of third calibration transistors;

controlling the first driver transistor by a data signal;

controlling the first calibration transistor by a most significant bit of a first calibration code;

controlling the plurality of second calibration transistors by a logical combination of the K most significant bits of the first calibration code and the L least significant bits of the first calibration code, K and L being positive integers; and controlling the plurality of third calibration transistors by a logical combination of the K most significant bits of a second calibration code and the L least significant bits of the second calibration code, wherein the first calibration code consists of the K most significant bits of the first calibration code and the L least significant bits of the second calibration code.

15. The method according to claim 14, wherein the K most significant bits of the calibration code are a thermometric code and the L least significant bits of the calibration code are a binary code.

16. The method according to claim 14, wherein K is one.

17. The method according to claim 16, further comprising:

performing a plurality of AND operations respectively between the most significant bit of the first calibration code and the L least significant bits of the first calibration code so as to generate a first control code; and performing a plurality of OR operations respectively between the most significant bit of the first calibration code and the L least significant bits of the first calibration code so as to generate a second control code.

18. The method according to claim 17, further comprising:

outputting the first control code to a first subset of the plurality of second calibration transistors; and outputting the second control code to a second subset of the plurality of second calibration transistors.

19. The method according to claim 17, further comprising:

performing a plurality of AND operations respectively between the most significant bit of the second calibration code and the L least significant bits of the second calibration code so as to generate a third control code;

performing a plurality of OR operations respectively between the most significant bit of the second calibration code and the L least significant bits of the second calibration code so as to generate a fourth control code;

outputting the third control code to a first subset of the plurality of third calibration transistors; and outputting the fourth control code to a second subset of the plurality of third calibration transistors.

20. The method according to claim 14, further comprising inverting the first calibration code to obtain the second calibration code.

* * * * *